United States Patent [19]

Mimura et al.

[11] Patent Number: 4,477,311
[45] Date of Patent: Oct. 16, 1984

[54] PROCESS AND APPARATUS FOR FABRICATING A SEMICONDUCTOR DEVICE

[75] Inventors: Takashi Mimura, Machida; Kohki Hikosaka, Yokohama; Kouichiro Odani, Sagamihara, all of Japan

[73] Assignee: Fujitsu Limited, Kawasaki, Japan

[21] Appl. No.: 561,967

[22] Filed: Dec. 15, 1983

[30] Foreign Application Priority Data

Dec. 28, 1982 [JP]  Japan .............................. 57-229708

[51] Int. Cl.³ ................... H01L 21/306; H01L 7/36; B05D 5/12; C23C 13/08
[52] U.S. Cl. .................................. 156/643; 118/50.1; 118/620; 118/728; 134/1; 148/175; 156/345; 156/646; 156/659.1; 156/662; 156/603; 156/612; 156/DIG. 103; 156/DIG. 111; 204/192 EC; 204/192 E; 204/298; 427/87; 427/93; 427/94; 427/307
[58] Field of Search ............... 148/1.5, 175, 187; 134/1; 427/38, 39, 86, 87, 93-95, 307; 204/192 EC, 192 E, 298; 118/728, 50.1, 620; 156/345, 643, 646, 654, 659.1, 662, 603, 610, 612, 614, DIG. 81, 103, 111, 61

[56] References Cited

U.S. PATENT DOCUMENTS

| | | | |
|---|---|---|---|
| 3,574,014 | 4/1971 | Hugle | 427/53.1 X |
| 4,039,357 | 8/1977 | Bachmann et al. | 29/572 X |
| 4,181,544 | 1/1980 | Cho | 148/175 |
| 4,239,584 | 12/1980 | Chang et al. | 148/175 X |

FOREIGN PATENT DOCUMENTS

| | | |
|---|---|---|
| 2391769 | 1/1978 | France. |
| 0060151 | 9/1982 | France. |
| 1528192 | 10/1978 | United Kingdom. |
| 0055032 | 6/1982 | United Kingdom. |
| 0056737 | 7/1982 | United Kingdom. |

OTHER PUBLICATIONS

J. Vac. Sci. Technol., 20(1), Jan. 1982, Hydrogen Plasma Etching of Semiconductors and Their Oxides, R.P.H. Chang et al, pp. 45-50.
J. Vac. Sci. Technol., 20(3), Mar. 1982, Summary Abstract: Hydrogen Plasma Etching of Semiconductors and Their Oxides, R.P.H. Chang et al, pp. 490-491.
IEEE Spectrum, vol. 17, No. 4, Apr. 1980, New York, G. Panish et al. "Molecular Beam Epitaxy", pp. 18-23.

*Primary Examiner*—William A. Powell
*Attorney, Agent, or Firm*—Staas & Halsey

[57] ABSTRACT

MOlecular beam epitaxy (MBE) requires that the surface of a substrate on which a semiconductor layer is formed by MBE be clean. Physical etching damages the substrate, while usual chemical etching damages vacuum pumps and contaminates MBE apparatuses. Hydrogen plasma etching can clean a substrate without damaging a substrate and a vacuum pump and without contaminating an MBE apparatus. Further, by combining MBE with formation of a protective layer without breaking the vacuum used in MBE, diffusion of an impurity in the semiconductor layer formed by MBE can be greatly decreased during a subsequent high-temperature heat treatment.

43 Claims, 19 Drawing Figures

H₂ PLASMA ETCHING

Ar MILLING (ETCHING)

PROCESS AND APPARATUS FOR FABRICATING A SEMICONDUCTOR DEVICE

BACKGROUND OF THE INVENTION

1. Field of the Invention

The present invention relates to a process and apparatus for fabricating a semiconductor device, in particular, a semiconductor device comprising a compound semiconductor layer formed by molecular beam epitaxy (MBE).

2. Description of the Prior Art

In the fabrication of semiconductor devices, in particular, compound semiconductor devices, semiconductor layers with different widths of forbidden bands, conduction types, or carrier concentrations are epitaxially grown on a semiconductor substrate to form a multilayer structure. This epitaxial growth may be effected by MBE, liquid phase epitaxy, vapor phase epitaxy, including organic-metal-pyrolysis vapor phase epitaxy, etc.

MBE allows precise control of the composition, the amount of doped impurity, and the growth rate of the semiconductor crystal layer; sharp change of the profile of the composition of a crystal layer or the amount of a doped impurity, for example, a width of change of approximately 1 nm; and growth of a crystal layer with a composition different from one obtained in the state of chemical equilibrium, not possible with liquid phase epitaxy. MBE is therefore a preferred technique for forming a semiconductor crystal multilayer structure with extremely thin layers and very sharp changes of composition at the interfaces of the layers, as in a superlattice device.

The surface of a substrate on which a crystal layer is to be formed by MBE should be kept clean to enable full use of the above-mentioned features of MBE. When the substrate is a crystal layer of gallium arsenide (GaAs), the substrate can be heated in advance to remove the oxide layer formed on the surface of the GaAs layer due to exposure to the atmosphere. However, when the substrate is aluminum gallium arsenide (AlGaAs), for example, the surface oxide layer formed on the surface of the substrate is aluminum oxide ($Al_2O_3$), a stable oxide difficult to remove by heat treatment. Such a thermally stable surface oxide layer may be removed by milling by, for example, argon (Ar) ions. This, however, constitutes physical etching, which damages the surface of the crystal substrate, and therefore cannot be used when fabricating, for example, a heterojunction-type field effect transistor (FET). In place of physical etching, use of dry chemical etching may be considered to remove the thermally stable surface oxide layer. Such etching, however, requires use of an etchant gas including chlorine (Cl), fluorine (F), carbon (C), or the like. Such a gas may damage an extremely high vacuum pump, such as an ion pump or a cryo pump, resulting in decreased power of evacuation after, for example, three months daily use, an extremely high vacuum being essential for MBE. It may also contaminate an MBE apparatus, resulting in corrosion. Therefore, in practice, dry chemical etching cannot be used in combination with MBE.

If MBE is effected onto an AlGaAs single crystal substrate without cleaning the surface thereof, an amorphous layer will be formed on the substrate. In the case of a GaAs single crystal layer and an AlGaAs single crystal layer superposed thereon with an opening exposing the surface of the GaAs layer, MBE will not form a single crystal layer fully in the opening since an amorphous layer is formed from the surface of the AlGaAs wall since the surface oxide layer of the AlGaAs layer could not be removed.

Problems also exist in the condition of the surface of a layer formed by MBE. In the conventional process for fabricating a semiconductor device, after the MBE is effected, the substrate and the crystal layer formed thereon by the MBE are cooled and then discharged from the MBE apparatus into the atmosphere before forming the semiconductor elements in and on the MBE layer.

In this prior art process, heat treatment after MBE deteriorates the properties of an active region in MBE layers near the top surface. Such deterioration results from diffusion of an impurity into the active region and should be prevented to maintain the excellent properties of the MBE layers.

For example, MBE is often used for the fabrication of heterojunction FET's. Here, MBE is used to form a nondoped GaAs layer and then a silicon-doped AlGaAs layer on a semi-insulating GaAs substrate. The interface of the GaAs layer and the GaAlAs layer is a heterojunction. An electron accumulating layer (two dimensional electron gas) is formed by displacement of electrons from the n-type AlGaAs layer (an electron supply layer) to the nondoped GaAs layer. If the electron sheet concentration of the electron storage layer is controlled by a voltage applied to a gate electrode formed on the n-type AlGaAs layer, the impedance of the conducting channel in the electron storage layer between a source electrode and a drain electrode is controlled. As a result, the device functions as a transistor.

To form ohmic contact regions of the source and drain electrodes of such a heterojunction-type FET, the following steps are often taken: selectively implanting silicon ions into multiple n-type AlGaAs and nondoped GaAs layers; forming a surface protective layer on the n-type AlGaAs layer; and heating at 700° C. to 800° C. to activate the ion-implanted regions. This type of heat treatment lowers the electron mobility, however, for example, from approximately 110,000 $cm^2/V.sec$ immediately after MBE to approximately 70,000 $cm^2/V.sec$ after heat treatment at 700° C. for 15 minutes. The lowering of the electron mobility results from diffusion of silicon (Si) ions from the n-type AlGaAs layer into the nondoped GaAs layer. This lowering of the electron mobility by heat diffusion of an impurity is an important problem in that it negates the effect of providing a heterojunction interface for three dimensionally separating an impurity-doped layer for generating carriers and a channel layer.

SUMMARY OF THE INVENTION

It is, therefore, an object of the present invention to enable use of dry chemical etching in combination with MBE without damage to a high vacuum pump or contamination of the MBE apparatus.

It is a further object of the present invention to prevent diffusion of an impurity in a semiconductor layer formed by MBE.

According to an aspect of the present invention, there is provided a process for fabricating a semiconductor device comprising the steps of etching a part of a semiconductor substrate in vacuum by hydrogen plasma; growing a semiconductor layer by MBE on the etched part without breaking the vacuum; and forming a protective layer on the surface of the semiconductor layer still without breaking the vacuum.

According to another aspect of the invention, there is provided an apparatus for fabricating a semiconductor device comprising a first closed chamber for MBE; a second closed chamber communicated with the first closed chamber for hydrogen-plasma etching; a third closed chamber communicated with the first closed chamber and preferably with the second closed chamber for forming an insulating layer; means for transporting a wafer among the first, second, and third closed chambers; a vacuum pump for evacuating one of the first, second, and third closed chambers; a hydrogen source connected to the second closed chamber for supplying hydrogen gas; and a gas source connected to the third closed chamber for supplying a required gas.

BRIEF DESCRIPTION OF THE DRAWINGS

Other objects, features, and advantages of the present invention will be apparent from the ensuing description of preferred embodiments in reference to the drawings, in which.

DESCRIPTION OF THE PREFERRED EMBODIMENTS

It is known that a semiconductor, for example, GaAs can be etched by hydrogen plasma (R.P.H. Chang, C.C. Chang and S. Darack "Hydrogen plasma etching of semiconductors and their oxides" J. Vac. Soc. Technol., 20 (1), January 1982, pp 45-50). The inventors of the present invention took note of the fact that hydrogen gas does not damage an extremely high vacuum pump nor deteriorate a GaAs, AlGaAs, or other semiconductor layer formed by MBE and that hydrogen plasma can etch an AlGaAs or other thermally stable semiconductor layer. The inventors made the invention based on this fact. The invention enables chemical etching of a substrate suitable for formation of a semiconductor layer on the substrate by MBE. The hydrogen plasma etching may be used not only for cleaning the surface of a semiconductor substrate formed by MBE but also for selectively etching a semiconductor substrate to form an opening, a cavity, etc. before forming a semiconductor layer by MBE.

The inventors also took note of the fact that forming a protective layer such as an AlN layer on the surface of a crystal layer formed by MBE in the vacuum used in MBE prevents formation of an oxide layer at the surface of the MBE crystal layer due to exposure of the MBE layer to the atmosphere and dissociation of a component atom of the MBE crystal layer and formation of holes and other defects in the crystal during heat treatment of the MBE layer, which can prevent or decrease diffusion of an impurity in the MBE crystal layer. The inventors found that the lowering of the electron mobility of a heterojunction-type FET is greatly accelerated by a surface oxide layer of the MBE layer formed between MBE and formation of a protective layer for heat treatment in the prior art, and, therefore, deterioration of electrical properties such as lowering of the electron mobility is greatly decreased by preventing formation of a surface oxide layer of the MBE layer due to prevention of diffusion of an impurity. Formation of a surface protective layer without breaking vacuum used in MBE is generally preferable for a semiconductor layer formed by MBE.

Figure 1:
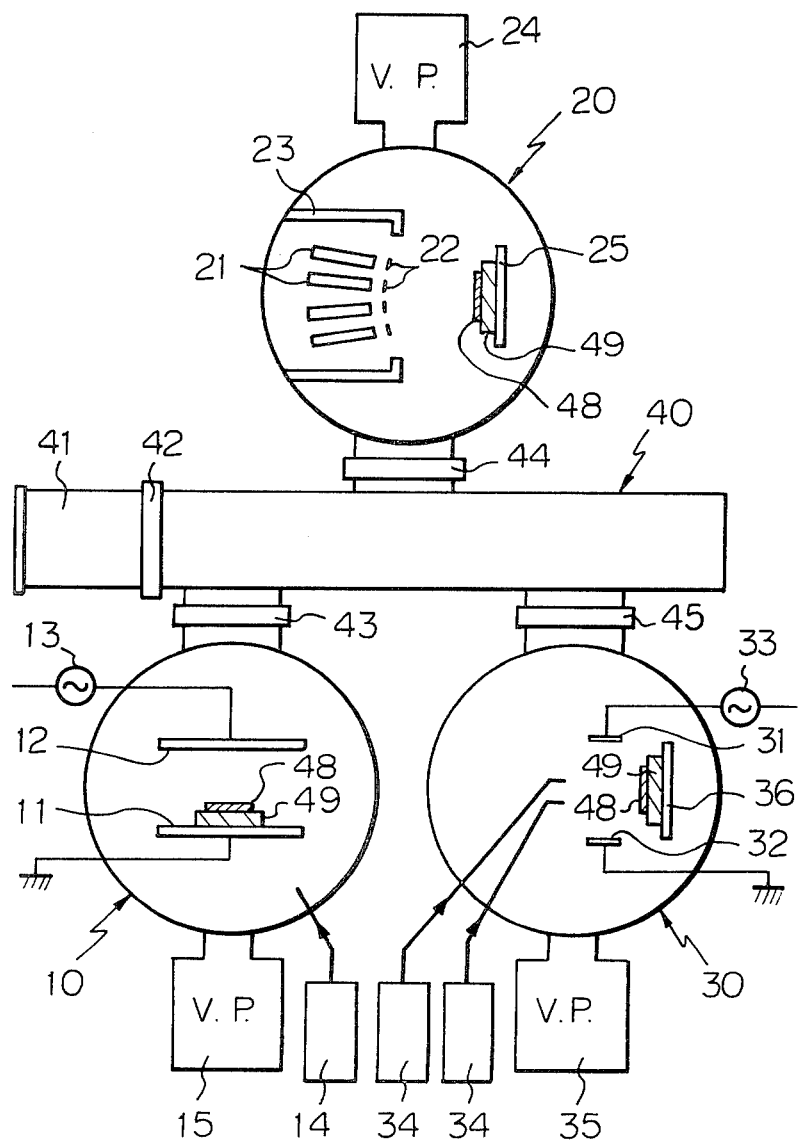
FIG. 1 is a schematic view of an apparatus for fabricating a semiconductor device according to the present invention.

FIG. 1 schematically illustrates an apparatus for fabricating a semiconductor device according to the process of the present ivnention. The apparatus comprises three chambers 10, 20, and 30 for $H_2$ plasma etching, for MBE, and for forming a protective layer, usually an insulating layer, respectively.

The $H_2$ plasma etching chamber 10 comprises parallel plate-shaped electrodes 11 and 12 connected to a high frequency power source 13. An $H_2$ gas source 14 and a vacuum pump 15 are connected to the chamber 10.

The MBE chamber 20 comprises cells 21 of molecular beam sources. A shutter 22 is provided for each cell 21 to allow selection of the required molecular beam source. The cells 21 are surrounded by a shroud 23 cooled by liquid nitrogen. An extremely high vacuum pump 24 such as an ion pump or a cryo pump is connected to the MBE chamber 20.

The chamber 30 for forming an insulating layer is, in this case, a sputtering chamber. Alternatively, it may be a chemical vapor deposition (CVD) chamber. The sputtering chamber comprises electrodes 31 and 32 connected to a high frequency power source 33, a target (not shown in the figure) being set on one of the electrodes 31 and 32. Gas sources 34 and a vacuum pump 35 are connected to the sputtering chamber 30.

The three chambers 10, 20, and 30 are closed to maintain the vacuum and are communicated with each other through a section 40, the section 40 comprising a wafer-transporting mechanism also closed to maintain the vacuum. The wafer-transporting section 40 has a chamber 41 for mounting and removing wafers. A valve 42 is provided between the chamber 41 and a main chamber of the wafer-transporting section 40. Valves 43, 44, and 45 are provided between the wafer-transporting section 40 and the $H_2$ plasma etching chamber 10, the MBE chamber 20, and the sputtering chamber 30, respectively. Thus, a wafer 48 to be treated can be transported between the $H_2$ plasma etching chamber 10, the MBE chamber 20, and the sputtering chamber 30 respectively without breaking the vacuum state.

Figure 2:
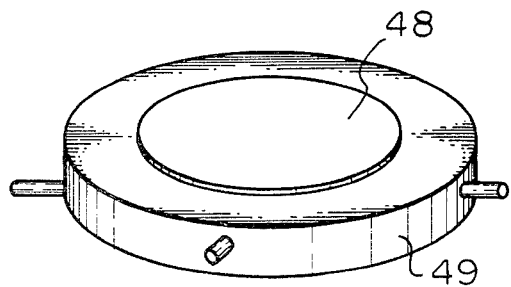
FIG. 2 is a perspective view of a wafer attached to a molybdenum (Mo) block.

Referring to FIG. 2, a wafer 48 to be treated is bonded onto an Mo block 49. This Mo block 49 is mounted on the wafer-transporting mechanism, transported to each chamber 10, 20, or 30, and held on the electrode 11 or by a holder 25 or 36. The three chambers 10, 20, and 30 can be closed individually. Individual vacuum pumps 15, 24, and 35 do not necessarily have to be used, i.e., a single vacuum pump or two vacuum pumps may be used in place of the three vacuum pumps.

It will be understood that the process of the present invention can be achieved by any conventional $H_2$ plasma etching chamber, MBE chamber, insulating-layer formation chamber, and wafer-transporting means and that the apparatus is therefore not limited to that described above. Further, the process of the present invention may involve only $H_2$ plasma etching and MBE and no formation of an insulating layer or only MBE and formation of an insulating layer and no $H_2$ plasma etching, therefore enabling simplification of the apparatus.

Below, an explanation will be given of the fabrication of a heterojunction-type FET according to the present invention.

Figure 3A:
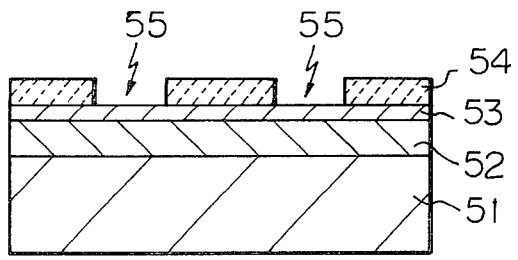
FIGS. 3a to 3f are sectional views of an FET in the steps of fabrication.

Referring to FIG. 3a, a nondoped GaAs layer 52 of, e.g., 600 nm and an n-type AlGaAs layer 53 of, e.g., 100 nm are continuously formed by MBE on a semi-insulating GaAs substrate 51. The n-type AlGaAs layer 53 is Si-doped at a dosage of, e.g., $1 \times 10^{18}$ cm$^{-3}$. A silicon dioxide ($SiO_2$) layer 54 of, e.g., 300 nm thickness is deposited onto the n-type AlGaAs layer 53 by a reactive sputtering process and selectively etched by a photolithography process to form windows 55 where source and drain regions are to be formed.

Figure 3B:
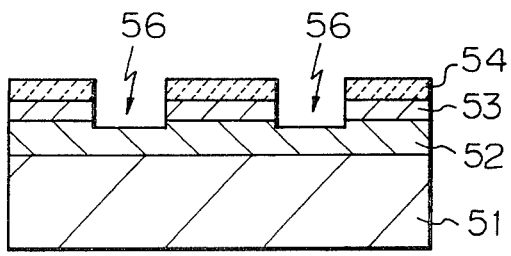

Referring to FIG. 3b, selective etching is conducted by using the $SiO_2$ layer 54 as a mask to form cavities 56 passing through the n-type AlGaAs layer 53 and a part of the nondoped GaAs layer 54, e.g., 300 nm thick. The wafer is then taken out of the etching chamber, resulting in contact with the atmosphere and, therefore, spontaneous formation of an oxide layer on the surface of the n-type AlGaAs layer 53 and the nondoped GaAs layer 54 in the cavity.

Referring to FIGS. 1 and 3b, the wafer having the cavities 56 is then mounted in the wafer-transporting mechanism in the section 40, transported to the $H_2$ plasma-etching chamber 10, and fixed onto the electrode 11. The valve 43 is closed. The three chambers 10, 20, and 30 are evacuated by the vacuum pumps 15, 24, and 35. Hydrogen gas is fed to the H plasma etching chamber 10 through a valve (not shown), the pressure in the chamber 10 being approximately $10^{-3}$ Torr. A high frequency power of 100 V, 13.56 MHz is applied to generate $H_2$ plasma in the chamber 10 so that the exposed surfaces of the n-type AlGaAs layer 53 and the nondoped GaAs layer 52 in the cavities 56 are etched with the $SiO_2$ layer 54 acting as a mask. This etching completely removes the oxide layer at the surface in the cavities 56. The etching rate of $H_2$ plasma etching is not so high, but it is sufficient for use in practice.

After the $H_2$ supply is stopped, the chamber 10 is evacuated again to a vacuum of approximately $10^{-7}$ to $10^{-8}$ Torr and the valves 43 and 44 are opened so as to transport the wafer 48 into the MBE chamber 20. The wafer 48 is fixed to the holder 25 and the valve 44 is closed.

Figure 3C:
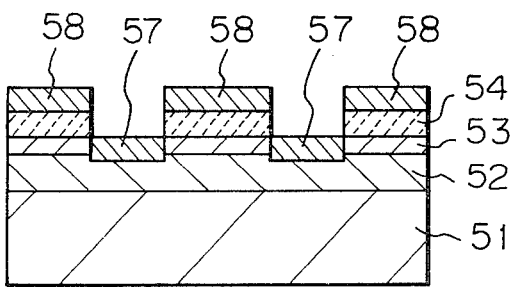

Referring to FIG. 1 and FIG. 3c, MBE is conducted to form source and drain regions 57 of n$^+$ type GaAs. In the MBE chamber 20 of, e.g., $10^{-10}$ Torr, Ga, As, and Si molecular beams are applied from three cells 21 onto the wafer, while controlling the temperature in the chamber 20 and of the cells 21 and the wafer 48. Selectively, source gases may be supplied into the MBE chamber 20 from gas sources through pipes having valves (gas source, pipes, and valves not shown in figures). The dosage of Si in the n$^+$-type GaAs source and drain region 57 is $1 \times 10^{18}$ cm$^{-3}$ to $2 \times 10^{18}$ cm$^{-3}$. Electron beam diffraction analysis confirms that the resultant n$^+$-type GaAs source and drain regions 57 are of complete single crystal and that an n$^+$-type amorphous layer 58 is formed on the surface of the $SiO_2$ layer 54.

Figure 3D:
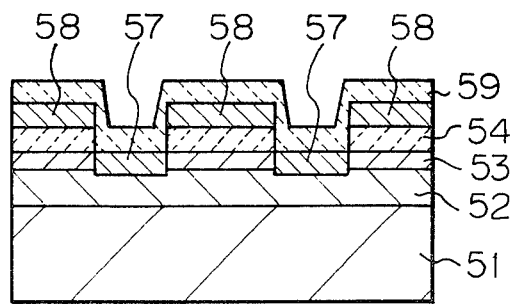

Referring to FIG. 1 and FIG. 3d, the MBE chamber 20 is evacuated again to clean it. The valve 44 is opened and the wafer 48 is transported to the insulating-layer formation chamber 30 in which the wafer 48 is fixed to the holder 36. The valve 45 is closed. An insulating layer 59 of silicon nitride ($Si_3N_4$) is formed on the entire surface as a protective layer. For example, a target of silicon is placed in the chamber 30 and nitrogen ($N_2$) gas is fed to the chamber 30 from a gas source 34. A high frequency of, e.g., 13.56 MHz is applied at $10^{-3}$ Torr so that Ar ions are accelerated to sputter the target, depositing an $Si_3N_4$ layer on the wafer 48.

Figure 3E:
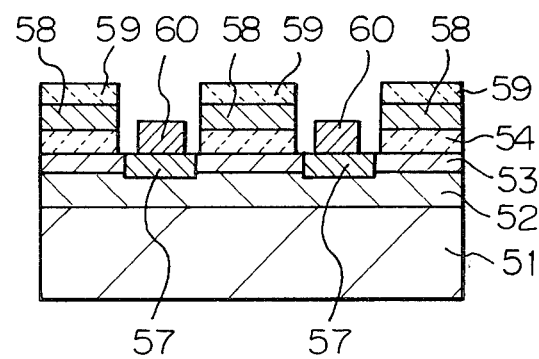

The wafer 48 is then taken out of the apparatus in FIG. 1. Referring to FIG. 3e, source- and drain-electrode contact windows are opened, then source and drain electrodes 60 are formed by depositing and then patterning gold-germanium/gold (Au·Ge/Au) layers.

Figure 3F:
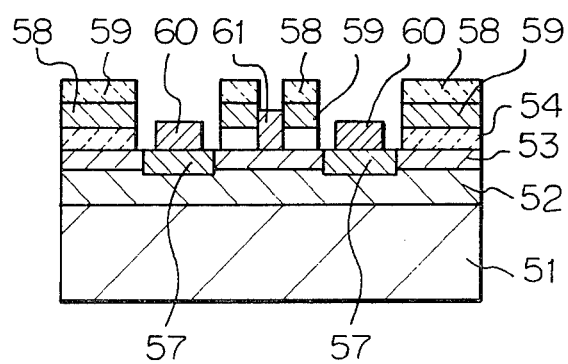

Referring to FIG. 3f, a gate-electrode contact window is opened, then a gate electrode is formed by depositing and then patterning a Schottky electrode metal layer such as aluminum (Al) or titanium/platinum/gold (Ti/Pt/Au). These processes for forming electrodes 60 and 61 are conventional.

While the above explanation has the cavities 56 formed by a separate etching apparatus, they may be formed by $H_2$ plasma etching in the chamber 10 of the apparatus in FIG. 1. In such a case, after etching, the wafer 48 can be transported directly to the MBE chamber 20 to form source and drain regions 57 by MBE, since no surface oxide layer is formed.

Figure 4:
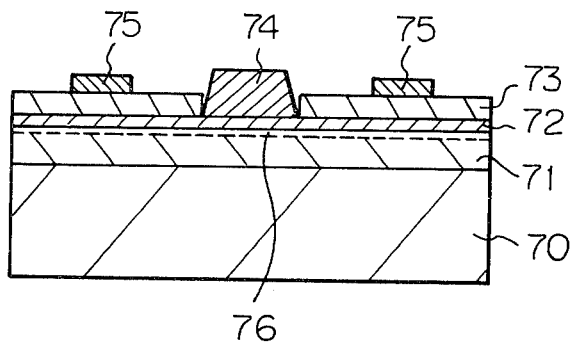
FIG. 4 is a sectional view of an FET for testing the effects of a semiconductor device according to the present invention.

The advantage of $H_2$ plasma etching over Ar milling or etching can be seen from an experiment of fabricating a heterojunction-type FET as in FIG. 4. This FET is fabricated by continuously growing on a semi-insulating GaAs layer 70 a nondoped GaAs layer 71 of 600 nm thickness, an n-type AlGaAs layer 72 of $1 \times 10^{18}$ cm$^{-3}$ to $2 \times 10^{18}$ cm$^{-3}$-Si dosage and 30 to 50 nm thickness, and an AlGaAs cap layer 73 of $1 \times 10^{18}$ cm$^{-3}$ to $2 \times 10^{18}$ cm$^{-3}$-Si dosage and 100 nm thickness by MBE. A gate electrode 74 is formed by selectively etching or milling the cap layer 73 in a depth of approximately 100 nm, depositing Al or Ti/Pt/Au layers, and patterning them. Source and drain electrode 75 are formed by depositing Au·Ge/Au layers and patterning them.

Figure 5A:
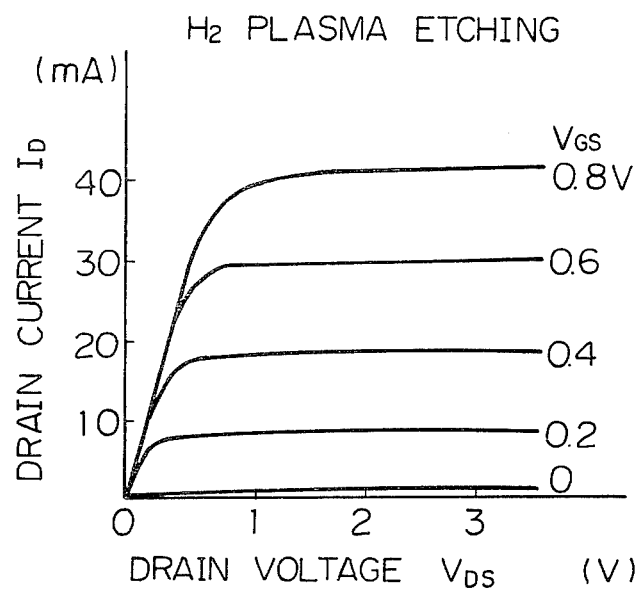
FIGS. 5a and 5b are graphs of I/V characteristics of FET's, in which $H_2$ plasma etching and Ar milling or etching are used, respectively.
Figure 5B:
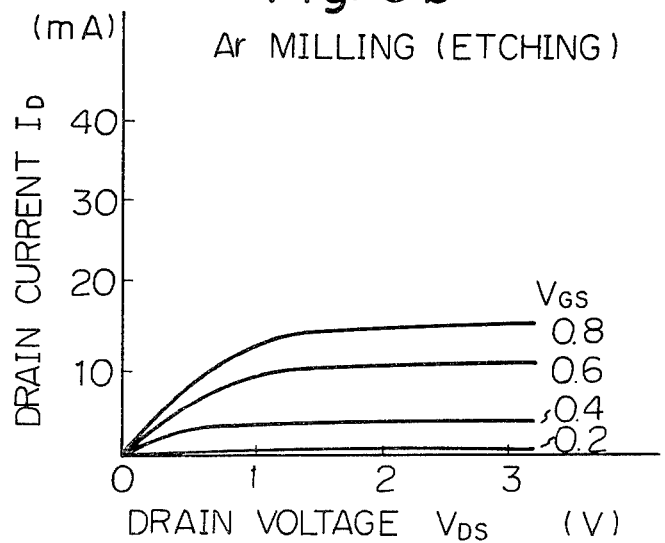

The etching or milling process is conducted by $H_2$ plasma etching or by Ar milling or etching, respectively. $H_2$ plasma etching is conducted in an parallel-plate-type etching apparatus at $10^{-3}$ Torr, 13.56 MHz, 100 V (50 W), and 10 nm/min. Ar milling or etching is conducted in an ion-milling-type etching apparatus at $10^{-3}$ Torr, 500 V, and 100 nm/min. The $I_D/V_{DS}$ (drain current/drain voltage) characteristics at different $V_{GS}$'s (gate voltage) of the thus obtained FET's are summarized in FIGS. 5a and 5b. As can be seen from FIGS. 5a and 5b, $H_2$ plasma etching greatly improved the $I_D/I_{VS}$ characteristics of the FET. This is because $H_2$ plasma etching does not damage the active layer of the FET, i.e., the channel region 76 existing in the nondoped GaAs layer 71 near the interface to the n-type AlGaAs layer 72.

Below, an explanation will be given of the fabrication of a heterojunction-type FET wherein the source and drain contact regions are formed by ion implantation. In this case, the problem of cleaning is not considered.

Only the problem of the condition of the surface of the semiconductor layer formed by MBE is considered, so an apparatus without a chamber 10 for $H_2$ plasma etching may be used.

Figure 6A:
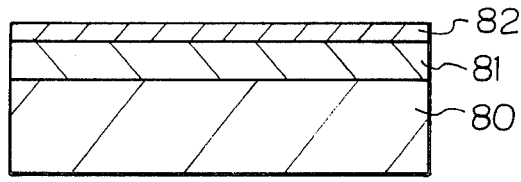
FIGS. 6a to 6e are sectional views of an FET in the steps of fabrication.

Referring to FIG. 1 and FIG. 6a, a wafer 48, i.e., a semi-insulating GaAs substrate 80, is fixed to the holder 25, and the chamber 20 for MBE is evacuated to, e.g., $10^{-10}$ Torr. Onto the substrate 80, a nondoped GaAs layer 81 of 1 μm thickness and an n-type AlGaAs layer 82 of $1 \times 10^{18}$ cm$^{-3}$ Si dosage and 100 nm thickness are formed by MBE. An electron accumulating layer is spontaneously formed in the nondoped GaAs layer 81 near the interface to the n-type AlGaAs layer 82.

Figure 6B:
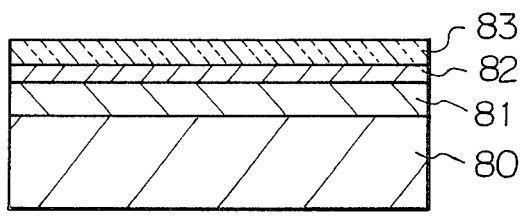

Referring to FIG. 1 and FIG. 6b, the wafer 48 is transported to the sputtering chamber 30 and fixed to the holder 36, the chamber 30 being evacuated to, e.g., $10^{-10}$ Torr, similar to that of the MBE chamber 20. For example, the electrode 31 has an Al target, and $N_2$ gas and Ar gas are fed into the sputtering chamber 30 from the gas sources. A high frequency power of 13.56 MHz and 500 W is applied between the electrodes 31 and 32. Thus, reactive sputtering is effected to form an aluminum nitride (AlN) layer 83 of, e.g., 100 to 300 nm on the surface of the n-type AlGaAs layer 82. Selectively, the protective layer may be, for example, of $SiO_2$ or $Si_3N_4$. The wafer is removed from the apparatus in FIG. 1.

Figure 6C:
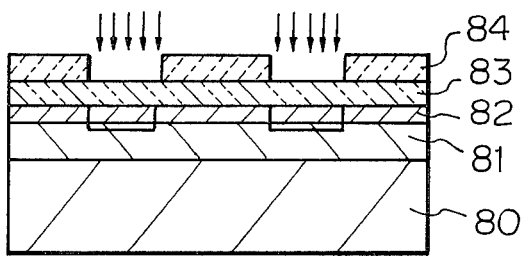

Referring to FIG. 6c, a mask 84 is formed by depositing an $SiO_2$ layer and then patterning it. By using the mask 84, Si ions are selectively implanted through the AlN layer 82 into the n-type AlGaAs layer 82 at 100 kV and $1 \times 10^{13}$ cm$^{-2}$.

Figure 6D:
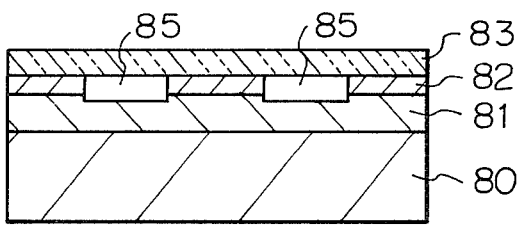

Referring to FIG. 6d, the mask 84 of $SiO_2$ is removed, for example, by hydrofluoric acid. Heat treatment is conducted, e.g., at 750° C. for 15 minutes to activate the Si ions, forming n+-type source and drain regions 85 of a carrier concentration of approximately $3 \times 10^{17}$ cm$^{-3}$.

Figure 6E:
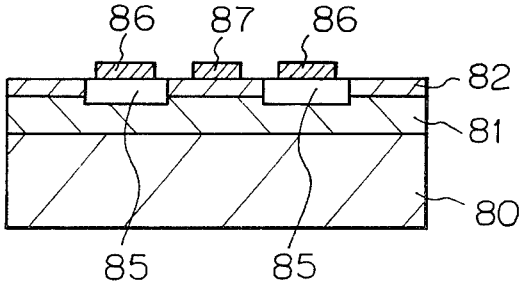

Referring to FIG. 6e, the AlN layer 83 is removed by, e.g., heated phosphoric acid. Source and drain electrodes 86 of, e.g., Au·Ge/Au are formed on the n+-type regions 85. A gate electrode 87 is formed of, e.g., Ti/Pt/Au.

In the resultant heterojunction-type FET, the electron accumulating layer has an electron concentration of approximately $5.7 \times 10^{11}$ cm$^{-3}$ and an electron mobility of approximately 100,000 cm$^2$/V sec. In a corresponding FET of the prior art, the electron accumulating layer had an electron concentration of approximately $6.1 \times 10^{11}$ cm$^{-2}$ and an electron mobility of approximately 70,000 cm$^2$/V sec. In this prior art, a protective layer of AlN is formed after the wafer is removed from an MBE apparatus. The original electron concentration and electron mobility of the electron accumulating layer just after MBE are approximately $5.6 \times 10^{11}$ cm$^{-3}$ and approximately 110,000 cm$^2$/V sec, respectively. It is clear that the deterioration of the electron accumulating layer is greatly decreased by the present invention.

Figure 9:
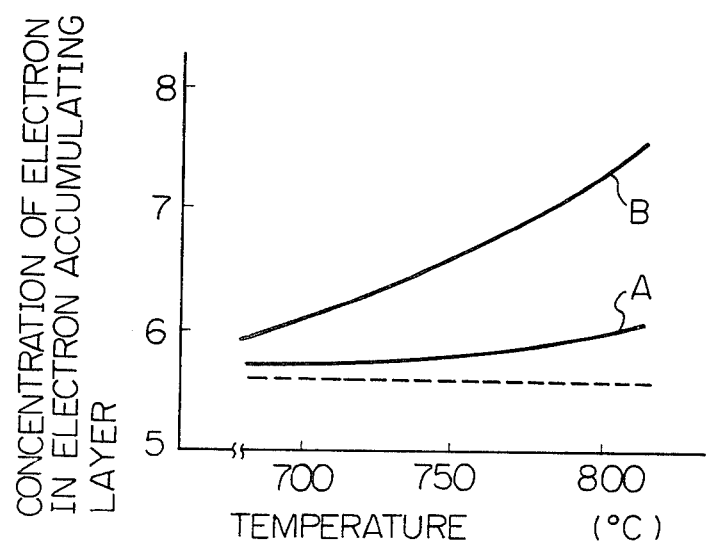
FIG. 9 is a graph of concentration of electrons in an electron storage layer.
Figure 7:
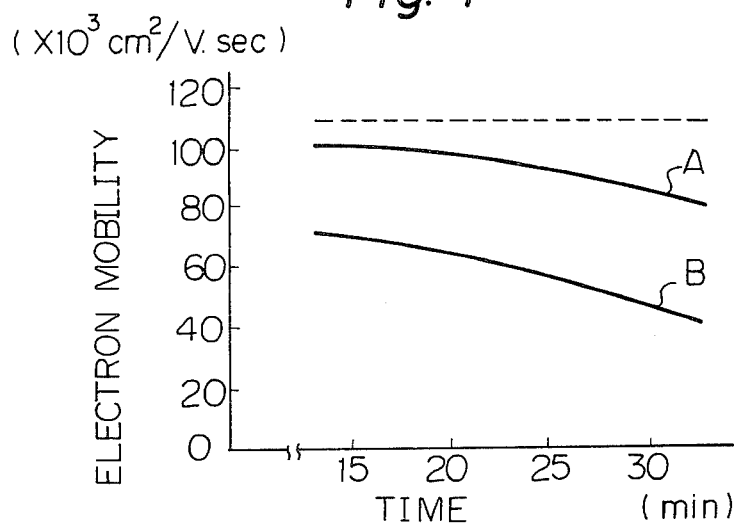
FIG. 7 is a graph of electron mobility against time of heat treatment.
Figure 8:
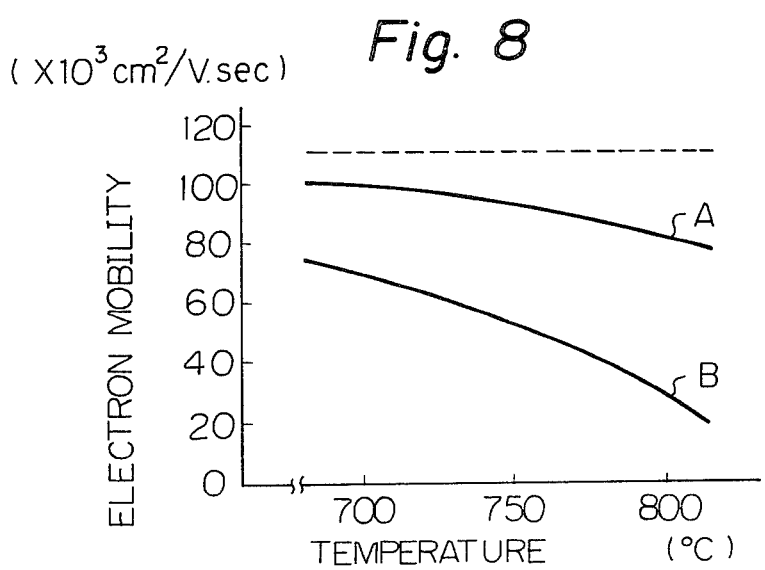
FIG. 8 is a graph of electron mobility against temperature of heat treatment.

The effects of conditions of heat treatment on electron mobility of heterojunction-type FET's fabricated according to a procedure similar to the above were studied. First, the heat treatment was conducted at approximately 700° C. for various time periods. The results are summarized in FIG. 7, in which line A denotes FET's according to the present invention and line B those of the prior art. Second, the heat treatment was conducted for 15 minutes at various temperatures. The results are summarized in FIGS. 8 and 9, in which lines A and B correspond to the present invention and the prior art respectively.

From these results, the present inventors found that, for all times and temperatures of heat treatment, the decline of the electron mobility in a heterojunction-type FET is greatly accelerated by a surface oxide layer formed between the steps of MBE and forming a protective layer and that, therefore, deterioration of electrical characteristics such as electron mobility can be greatly decreased by preventing formation of a surface oxide layer of a semiconductor layer formed by MBE.

While the above explanations concerned heterojunction-type FET's, the present invention may also be used for other semiconductor devices. It is known that MBE is often used in other semiconductor devices such as semiconductor lasers and photodiodes and that ion implantation is often used for forming, for example, regions of different conduction types in a layer formed by MBE in a semiconductor device.

Since known photodiodes and photolasers have, in general, a thicker cap layer on an active layer than that of a heterojunction-type FET, a surface oxide layer has little effect on the active layer. However, leakage current in a photodiode, etc. is increased by oxidation of the surface of a semiconductor substrate, which can be prevented according to the present invention. Further, in a reach-through type avalanche photodiode (APD) in which a buried layer of a high impurity concentration is formed in a multiplication layer of the APD, the present invention may be applied for a process comprising ion implantation of an impurity into a first epitaxial layer followed by growth of a second epitaxial layer. As a result, deterioration of the APD is decreased due to the prevention of formation of an oxide layer at the interface of the first and second epitaxial layers.

According to the present invention, formation of a surface oxide layer at the surface of a grown crystal layer is prevented, resulting in decreased diffusion of an impurity in the crystal layers during subsequent heat treatment in a process for fabricating a semiconductor device.

We claim:

1. A process for fabricating a semiconductor device, comprising the steps of:
   etching a part of a semiconductor substrate by hydrogen plasma in vacuum;
   growing a semiconductor layer on the semiconductor substrate at the etched part by molecular beam epitaxy with unbroken vacuum; and
   forming a protective layer on the surface of the semiconductor layer with unbroken vacuum.

2. A process according to claim 1, wherein the semiconductor layer is of a compound semiconductor.

3. A process according to claim 1, wherein the semiconductor layer is of a GaAs.

4. A process according to claim 1, wherein the semiconductor substrate is of a compound semiconductor.

5. A process according to claim 1, wherein at least a part of the semiconductor substrate is composed of AlGaAs.

6. A process according to claim 1, wherein the etching step is effected to clean the surface of the semiconductor substrate.

7. A process according to claim 1, wherein the etching step is effected to form a cavity or opening in the semiconductor substrate.

8. A process according to claim 1, wherein after the step of forming a protective layer, heat treatment is conducted on the semiconductor layer covered with the protective layer.

9. A process according to claim 8, wherein the protective layer is of an insulating layer.

10. A process according to claim 8, wherein the protective layer is of one of the group of AlN, SiO$_2$, and Si$_3$N$_4$.

11. A process according to claim 8, wherein the protective layer is formed by sputtering or by a CVD process.

12. A process for fabricating a semiconductor device, comprising the steps of:
   etching a part of a semiconductor substrate by hydrogen plasma in vacuum and then
   growing a semiconductor layer on the semiconductor substrate at the etched part by molecular beam epitaxy with unbroken vacuum.

13. A process according to claim 12, wherein the semiconductor layer is of a compound semiconductor.

14. A process according to claim 13, wherein the semiconductor layer is of GaAs.

15. A process according to claim 12, wherein the semiconductor substrate is of a compound semiconductor.

16. A process according to claim 12, wherein at least a part of the semiconductor substrate is composed of AlGaAs.

17. A process according to claim 12, wherein the etching step is effected to clean the surface of the semiconductor substrate.

18. A process according to claim 12, wherein the etching step is effected to form a cavity or opening in the semiconductor substrate.

19. A process for fabricating a semiconductor device, comprising the steps of:
   growing a semiconductor layer by molecular beam epitaxy in vacuum and then
   forming a protective layer on the surface of the semiconductor layer with unbroken vacuum.

20. A process according to claim 19, wherein after the step of forming a protective layer, heat treatment is conducted on the semiconductor layer covered with the protective layer.

21. A process according to claim 19, wherein the semiconductor layer is of a compound semiconductor.

22. A process according to claim 21, wherein the semiconductor layer is of GaAs.

23. A process according to claim 19, wherein the protective layer is of an insulating layer.

24. A process according to claim 19, wherein the protective layer is of one of the group of AlN, SiO$_2$, and Si$_3$N$_4$.

25. A process according to claim 19, wherein the protective layer is formed by sputtering or by a CVD process.

26. An apparatus for fabricating a semiconductor device, comprising:
   a first closed chamber for molecular beam epitaxy;
   a second closed chamber for hydrogen plasma etching communicated with the first chamber;
   a third closed chamber for forming a protective layer communicated with the first chamber;
   means for transporting a wafer to be treated among the first, second, and third chambers with unbroken vacuum;
   a vacuum pump for evacuating one of the first, second, and third chambers;
   a hydrogen source connected to the second chamber for supplying hydrogen gas; and
   a gas supply connected to the third chamber for supplying a required gas.

27. An apparatus according to claim 26, wherein the second closed chamber for hydrogen plasma etching is of a parallel plate-shaped electrode type.

28. An apparatus according to claim 26, wherein the third closed chamber for forming a protective layer is a sputtering chamber.

29. An apparatus according to claim 26, wherein the third closed chamber for forming a protective layer is a CVD chamber.

30. An apparatus according to claim 26, wherein a valve is provided between the wafer-transporting means and each of the first, second, and third closed chambers.

31. An apparatus according to claim 26, wherein the vacuum pump is an ion pump or a cryo pump.

32. An apparatus according to claim 26, wherein an individual vacuum pump is connected to each of the first, second, and third closed chambers.

33. An apparatus for fabricating a semiconductor device, comprising:
   a first closed chamber for hydrogen plasma etching;
   a second closed chamber for molecular beam epitaxy communicated with the first chamber through a gate valve;
   means for transporting a wafer to be treated between the first and second chambers by external operation with unbroken vacuum;
   a vacuum pump for evacuating one of the first and second chambers; and
   a hydrogen source connected to the first chamber for supplying hydrogen gas.

34. An apparatus according to claim 33, wherein the first closed chamber for hydrogen plasma etching is of a parallel plate-shaped electrode type.

35. An apparatus according to claim 33, wherein a valve is provided between the wafer-transporting means and each of the first and second closed chambers.

36. An apparatus according to claim 33, wherein the vacuum pump is an ion pump or a cryo pump.

37. An apparatus according to claim 33, wherein an individual vacuum pump is connected to each of the first and second closed chambers.

38. An apparatus for fabricating a semiconductor device, comprising:
   a first closed chamber for molecular beam epitaxy;
   a second closed chamber for forming a protective layer communicated with the first closed chamber;
   means for transporting a wafer to be treated between the first and second chambers;
   a vacuum pump for evacuating one of the first and second chambers; and
   a gas source connected to the second chamber for supplying a required gas.

39. An apparatus according to claim 38, wherein the third closed chamber for forming a protective layer is a sputtering chamber.

40. An apparatus according to claim 38, wherein the third closed chamber for forming a protective layer is a CVD chamber.

41. An apparatus according to claim 38, wherein a valve is provided between the wafer-transporting means and each of the first and second closed chambers.

42. An apparatus according to claim 38, wherein the vacuum pump is an ion pump or a cryo pump.

43. An apparatus according to claim 38, wherein an individual vacuum pump is connected to each of the first and second closed chambers.

* * * * *

UNITED STATES PATENT AND TRADEMARK OFFICE
CERTIFICATE OF CORRECTION

PATENT NO.  : 4,477,311

DATED       : October 16, 1984

INVENTOR(S) : Mimura et al.

It is certified that error appears in the above-identified patent and that said Letters Patent is hereby corrected as shown below:

Front page, ABSTRACT, "MOlecular" should be --Molecular--.

Col. 6, line 19, "3c" should be --3e--.

Col. 7, line 30, "82"(1st occurrence) should be --83--.

Signed and Sealed this

Thirtieth Day of July 1985

[SEAL]

Attest:

DONALD J. QUIGG

Attesting Officer     Acting Commissioner of Patents and Trademarks